United States Patent [19]

West et al.

[11] Patent Number: 4,602,125

[45] Date of Patent: Jul. 22, 1986

[54] MOUNTING PAD WITH TUBULAR PROJECTIONS FOR SOLID-STATE DEVICES

[75] Inventors: Roger A. West, Woodbury; Dallas R Humphrey, Golden Valley; Carl R. Bergquist, Minnetonka; David C. DeGree, Burnsville, all of Minn.

[73] Assignee: The Bergquist Company, Minneapolis, Minn.

[21] Appl. No.: 732,582

[22] Filed: May 10, 1985

[51] Int. Cl.⁴ .................... H01B 17/56; H05K 7/00; H01L 23/14
[52] U.S. Cl. .................... 174/138 G; 165/185; 174/16 HS; 277/189; 361/403
[58] Field of Search .......... 174/16 HS, 138 R, 138 D, 174/138 G, 153 R, 153 G; 165/80 B, 185; 361/386, 388, 389, 403, 418; 428/447; 277/178, 189

[56] References Cited

U.S. PATENT DOCUMENTS

| | | | |
|---|---|---|---|
| 3,025,437 | 3/1962 | Van Namen, Jr. et al. | 174/138 G X |
| 3,041,573 | 6/1962 | Offerman | 174/138 G X |
| 3,122,679 | 2/1964 | Kislan et al. | 174/138 G X |
| 3,272,952 | 9/1966 | McKeon | 174/153 R X |
| 3,325,582 | 6/1967 | Ehrmann et al. | 174/138 G X |
| 3,366,914 | 1/1968 | McManus et al. | 174/138 G X |
| 3,391,242 | 7/1968 | Sudges | 174/138 G X |
| 3,605,062 | 9/1971 | Tinkelenberg et al. | 361/403 X |
| 3,701,075 | 10/1972 | Schullstrom et al. | 361/403 X |
| 4,211,890 | 7/1980 | Sado et al. | 174/138 G X |
| 4,395,585 | 7/1983 | Polcyn | 174/138 G |

FOREIGN PATENT DOCUMENTS 281571 6/1952 Switzerland ..................... 174/153 G Primary Examiner—Laramie E. Askin
Attorney, Agent, or Firm—Orrin M. Haugen; Thomas J. Nikolai

[57] ABSTRACT

A thermally conductive electrically insulative laminate for use as a mounting pad and electrical chassis barrier for use with solid-state electronic devices. The pad includes a number of bores with tubular projections extending outwardly therefrom for insulatively protecting the shanks of the mounting screws, bolts or other conductive materials from contact with the substrate. Additionally, the tubular projections are provided with radially extending retention burrs for mechanically holding the mounting pad in place on a substrate pending actual mounting of a semiconductor device thereon.

2 Claims, 6 Drawing Figures

MOUNTING PAD WITH TUBULAR PROJECTIONS FOR SOLID-STATE DEVICES

BACKGROUND OF THE INVENTION

The present invention relates generally to an improved thermally conductive and electrically insulative laminate for use as a mounting pad and electrical chassis barrier in combination with solid-state electronic devices, particularly for mounting such devices with an electrically insulative layer being interposed between the thermally conductive base of the solid-state device and the chassis or other ultimate heat sink and wherein the pad is provided with tubular projections for insulatively protecting the shanks of the mounting screws or bolts from contact with the substrate including any electrical conductors disposed thereon. The properties required are that the laminates be both thermally conductive, electrically insulative, and conformable to the devices being received or mounted thereon, a combination of properties not readily found in nature.

Mounting pads for solid-state devices have been known in the past, with examples of such devices being disclosed and claimed in copending application Ser. No. 584,897, filed Feb. 29, 1984, and entitled "MOUNTING PAD FOR SOLID-STATE DEVICES". The present invention, while utilizing certain features of the device disclosed in copending application Ser. No. 584,897, is provided with the additional feature of self-locking tubular projections which extend along an axis normal to the plane of the mounting pad.

In the assembly of electronic systems, it is frequently desirable, as one operation, to initially set the mounting pad in place on a circuit board or other mounting substrate. In certain applications the mounting pad may be set in place, with the next operation including the actual positioning of the solid-state device on the pad. However, in certain assembly operations and systems, it may become desirable to move, rotate, invert, or otherwise shift the positioning of the substrate in such a way that it becomes desirable for the mounting pad to be at least temporarily held or affixed to the substrate. In accordance with the present invention, a system is provided which includes providing tubular projections for the mounting pad which are designed to extend through the thickness of the substrate, and which are provided with retention burrs for holding the mounting pad in place prior to receiving the solid-state device thereon.

It is desirable that the mounting pad be thermally conductive and electrically insulative.

Materials, including elements, compounds, and compositions of matter rarely possess the combined properties of being both thermally conductive and electrically insulative. Since the number of materials possessing such a combination of properties is relatively limited, one must seek compromises in other physical and electrical properties in order to find a useful material. Also, one technique for decreasing the thermal impedance in an electrically insulative material is to provide a material with an extremely thin cross-sectional thickness. However, as the cross-sectional thickness decreases, the risk of rupture, cracking, or fracture of the material increases, thereby increasing the risk for electrical failures. Also, in the present arrangement, a flexible tubular projection is employed, along with flexible retention burrs, so as to provide for suitable electrical insulation and mechanical durability to achieve appropriate mounting of the solid-state device on the mounting pad.

Further desirable properties or characteristics include toughness, and mechanical durability, these properties rendering the barrier member resistant to cutting, ripping, cracking, or puncturing during subsequent assembly operations. In addition, it is desirable that the barrier member per se be reasonably pliable so as to increase the area of surface contact in order to maximize the heat transfer, with the tubular projections and retention burrs being, of course, reasonably resilient, pliable, and mechanically tough. The mechanical properties are desirable in order to provide an electrical chassis barrier member which is sufficiently tough and durable to withstand the forces of over-torqued mounting screws or bolts, and furthermore reduce the occurrences of burr cut-through or cracking, which are frequent occurrences in production operations.

With respect to other physical-thermal properties which are desirable for use in combination with high power type solid-state devices, and in addition to being thermally conductive, it is desirable that the material possess an appropriate high temperature capability.

In co-pending application Ser. No. 584,897, filed Feb. 29, 1984, it is suggested that a laminate utilizing polyimide (amide) film be employed for use in combination with power type semiconductor devices. Such devices have, of course, been found to be highly useful for device mounting applications. The devices of the present invention may also employ a laminate structure for the mounting pad portion of the device, with the tubular projections and retention burrs being fabricated from silicone rubber or other desired moldable substrate material.

SUMMARY OF THE INVENTION

In accordance with the present invention, a thermally conductive electrically insulative solid-state device mounting pad member is provided, with the device including tubular projections with retention burrs for assisting in holding the mounting pad in place while assembly operations are in progress. The mounting pad member of the present invention comprises a relatively thin molded pad, which may be a layer of silicone rubber or alternatively be in the form of a laminate which is both tough and durable, with good electrical and mechanical properties, and having high temperature capabilities including resistance to high temperature problems including high pressure creep. The tubular projections are preferably fabricated from silicone rubber, which is moldable through the use of conventional molding operations. When the pad portion of the device is a laminate, it preferably includes at least three layers with a pair of outer layers disposed on opposite sides of a center film layer. The center layer may comprise a polyimide (amide) film filled with a quantity of a particulate solid selected from the group consisting of aluminum oxide and boron nitride, and with the outer layers consisting essentially of silicone rubber preferably containing a quantity of a particulate solid, preferably aluminum oxide or boron nitride. The combination of features available from the mounting pad are indicated above, and have been found to provide a highly versatile and operationally advantageous mounting pad or chassis barrier for use in the assembly of electronic systems, including the mounting of solid-state electronic devices onto heat dissipating chassis or other heat sink assemblies without requiring intermediate mounting or temporary retaining operations for the pad.

Therefore, it is a primary object of the present invention to provide an improved thermally conductive electrically insulative member which is designed to be held upon a mounting pad without need for adhesive films or the like, and with the member having good thermal properties which permit its use in a variety of applications.

It is a further object of the present invention to provide an improved thermally conductive electrically insulative member for use as a chassis barrier in combination with solid-state electronic devices, wherein the member comprises a mounting pad with tubular projections extending therefrom to insulatively isolate a mounting screw or bolt from the substrate, and with the tubular projections including retention burrs for retaining the pad in place on a mounting substrate.

Other and further objects of the present invention will become apparent to those skilled in the art upon a study of the following specification, appended claims, and accompanying drawing.

IN THE DRAWING

FIG. 1 is an elevational view, partially in section, illustrating a typical application of the thermally conductive electrically insulative mounting pad prepared in accordance with the present invention, and illustrating the manner in which the tubular projections extend therefrom, and further illustrating the manner in which such a device is typically interposed between a solid-state electronic device such as a transistor and a base chassis or substrate, with FIG. 1 being taken, at least partially, along the line and in the direction of the arrows 1—1 of FIG. 2;

DESCRIPTION OF THE PREFERRED EMBODIMENT

Figure 1:
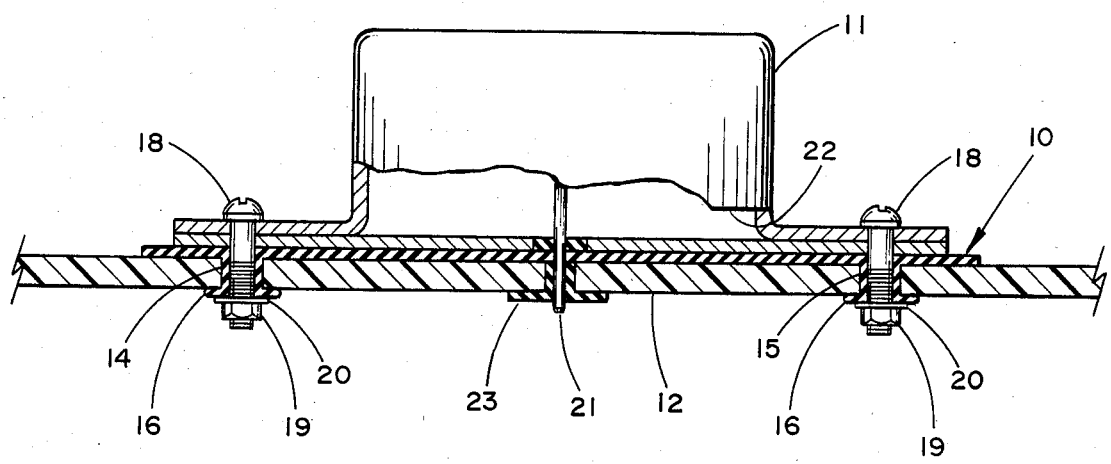
Figure 2:
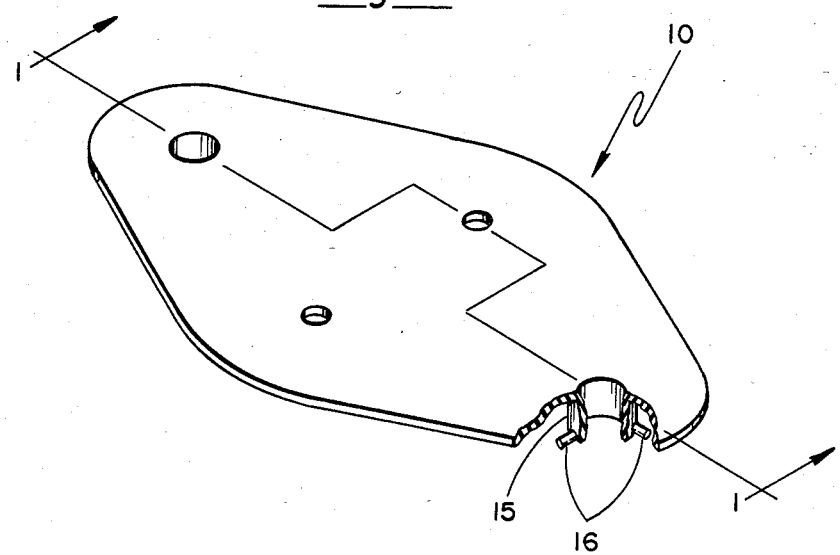
FIG. 2 is a perspective view partially broken away of a typical thermally conductive electrically insulative member fabricated in accordance with the present invention.
Figure 3:
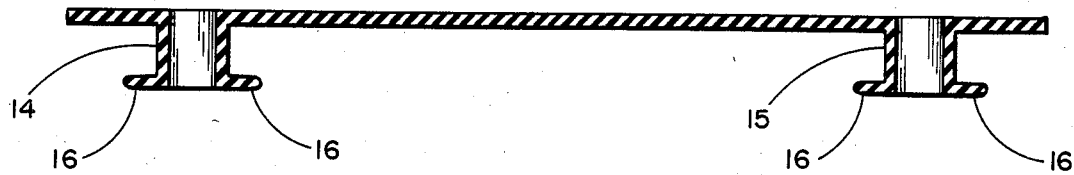
FIG. 3 is a vertical sectional view of a device fabricated in accordance with the present invention.
Figure 4:
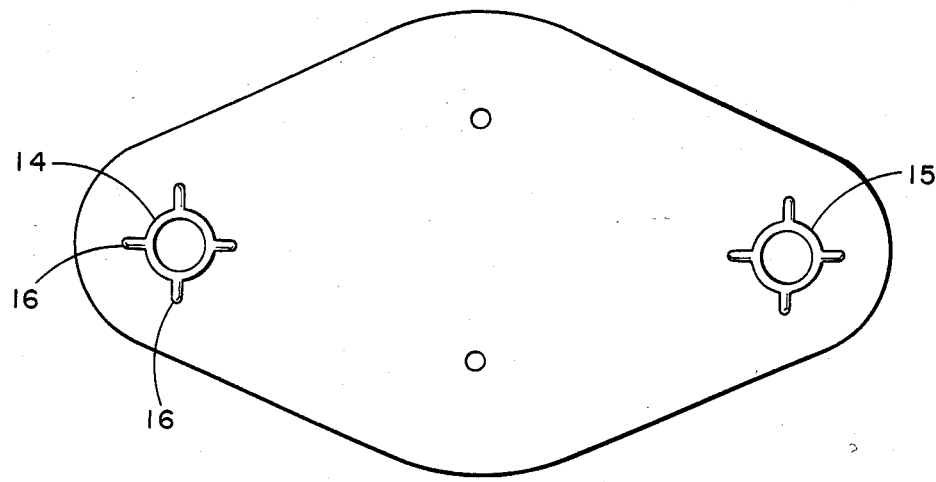
FIG. 4 is a bottom plan view of a device fabricated in accordance with the present invention, and illustrating the manner in which the retention burrs extend radially outwardly from the tubular projections.

In accordance with the preferred embodiment of the present invention, the thermally conductive electrically insulative member generally designated 10 is utilized as a chassis mounting barrier pad in combination with a solid-state electrical device such as transistor assembly 11, with the member 10 being interposed between the undersurface of the metal base substrate of transistor 11 and metallic chassis or rigid circuit board 12. The thermally conductive electrically insulative member 10 is preferably in the form of a laminate, but may, alternatively, be in the form of a molded silicone rubber device. As an alternative to silicone rubber, other film or layer forming materials with high temperature capability may be employed.

In those instances where a laminate is employed, films of polyimide (amide) may be used and are available commercially. Polymeric poly(imide-amides), or polyimides as they are sometimes referred to herein, as a general class of materials have been known for many years. Reference is made to U.S. Pat. Nos. 2,149,286; 2,407,896; 2,421,024; and 2,502,576. Polyimides having exceptional capabilities at high temperatures are disclosed in U.S. Pat. No. 2,710,853, these high temperature polyimides being prepared from an aromatic dianhydride such as pyromellitic dianhydride together with an aromatic diamine, and particularly 4,4' diamino diphenylether or para-phenylenediamine. Polyimides of the type disclosed in these various patents are available commercially in several forms, cured films, partially reacted resins, and the like. Such films are available commercially under the registered trademark KAPTON from E. I. DuPont de Nemours Corp. of Wilmington, Del. Moreover, such films are available commercially when filled with a particulate solid selected from the group consisting of aluminum oxide (alumina) and boron nitride. More specifically, the particulate solids preferably have a particle size with a major dimension ranging from between about 2 microns and 30 microns, and are included in the polymer matrix in an amount ranging from between about 10% and 50% by volume.

With continuing attention being directed to the drawings, a pair of tubular projections 14 and 15 extend from the plane of the pad, with projections 14 and 15 having radially extending retention burrs 16—16 extending therefrom. The retention burrs are preferably fabricated from silicone rubber so as to be flexible, as well as durable, and provide a means for temporarily retaining or supporting the mounting pad in place on the substrate and/or circuit board. While retention burrs are set forth in the embodiments illustrated herein, other related forms of radially extending members may be employed with either greater or lesser degrees of circumferential integrity.

As indicated hereinabove, the aluminum oxide or boron nitride particles may be utilized as fillers for the polyimide (amide) film in an amount ranging from between about 10% and 50% by volume. For most electrical applications, however, it has been found that a loading of about 30% to 35% by volume is preferred for aluminum oxide, and about 35% by volume for boron nitride. Also, boron nitride, being anisotropic thermally, is the desired filler. Exposure to strong electrical fields may be employed in the formation of films as they are being filled and cured with boron nitride, for example, in order to enhance the anisotropic thermal characteristics.

When aluminum oxide is employed as the particulate solid, it is generally preferred that an amount of about 30% to 35% of aluminum oxide particles be utilized. Also, for most purposes, particle sizes of aluminum oxide and boron nitride in the range of about 2 to 10 microns are preferred.

It has been found that silicone rubber coated polyimide (amide) films containing aluminum oxide or boron nitride particulate solids possess a desirable balance of physical and electrical properties including a toughness which enhances the ability of the members to withstand forces frequently occasioned due to over-torqued screws or bolts and also possess a resistance to tearing, so as to reduce or eliminate the occurences of electrical shorts caused by burr cut-throughs or cracking and a substantial reduction of thermal aging. The high temperature properties of the polyimide (amide) films, together with the silicone rubber coatings, are such that exposure to wave-solder processes is possible, a feature which is desirable for use in electronic assembly operations. In addition, the properties of silicone rubber coated polyimide (amide) films are such that resistance to deterioration due to exposure to chemicals or solvents is reduced.

Preferably, the durometer of the silicone rubber layer, when cured, is in the range of about 75. Such silicone rubber polymers are available commercially, and are available from the General Electric Co. of Schenectady, N.Y. The polymers are preferably loaded with a quantity of particulate solids selected from the group consisting of aluminum oxide and boron nitride. It has been ascertained that the electrical properties of silicone rubber do not deteriorate when loaded with aluminum oxide or boron nitride particulate solids in the range contemplated herein, and for certain applications the electrical properties of the device are improved. The quantity of loading of aluminum oxide or boron nitride particles is preferbly in the range of between about 30% and 40% by volume based upon silicone rubber solids. The particle size is preferably in the range of from about 2 microns to 10 microns. Also, while it has been indicated that aluminum oxide or boron nitride solids may be employed, mixtures or blends of these materials may be employed as well.

In a typical surface mounting application for a solid-stage electronic device such as transistor 11, and with attention being directed to FIG. 1 of the drawing, transistor 11 is mounted upon chassis 12 by means of bolts 18—18, with attachment being rendered secure by nuts 19—19. Electrical insulation is achieved by virtue of the tubular or cylindrical projections 14, 15, together with the insulating washers 20. Also, lead pin 21 extends outwardly from conductive base member 22 of transistor assembly 11, through an insulator 23. Pin 21 is appropriately coupled to the circuitry in a conventional manner.

The thermal, electrical, and other properties of a typical product prepared in accordance with the present invention are set forth in Table I hereinbelow:

TABLE I

| PROPERTY | TYPICAL VALUE | TEST METHOD |
| --- | --- | --- |
| Thickness | .006 +/− .002 inch | |
| Continuous Use Temp. | −60 to +200° C. | |
| Volume Resistivity | $10^{13}$ minimum | ASTM D 257 |
| Dielectric Strength | 6000 Volts min. | ASTM D 149 |
| Tenacity, Minimum Film | 18.6 KPSI | ASTM D 412 |
| Thermal Conductivity | $1.2 \times 10^{-3}$ CAL/°C. CM SEC. | |
| Thermal Resistance | .40° C/W | |

TABLE I-continued

| PROPERTY | TYPICAL VALUE | TEST METHOD |
| --- | --- | --- |
| Resistance | | |

In Table I, the thermal conductivity is given as that observed for an alumina filled material (18% by volume fill in the polyimide (amide) center film and 35% by volume fill in the silicone rubber layers). When boron nitride is employed, this value is increased to $1.5 \times 10^{-3}$ CAL/°C. CM SEC., it being understood that the thermal conductivity for boron nitride filled materials may be improved by certain processing techniques by virtue of its higher thermal conductivity and the anisotropic thermal behavior of the product.

In addition to alumina and boron nitride, other materials with good electrical properties and high temperature capability may be used including, for example, silica, beryllium oxide, aluminum nitride, silicon carbide and silicon nitride.

Figure 5:
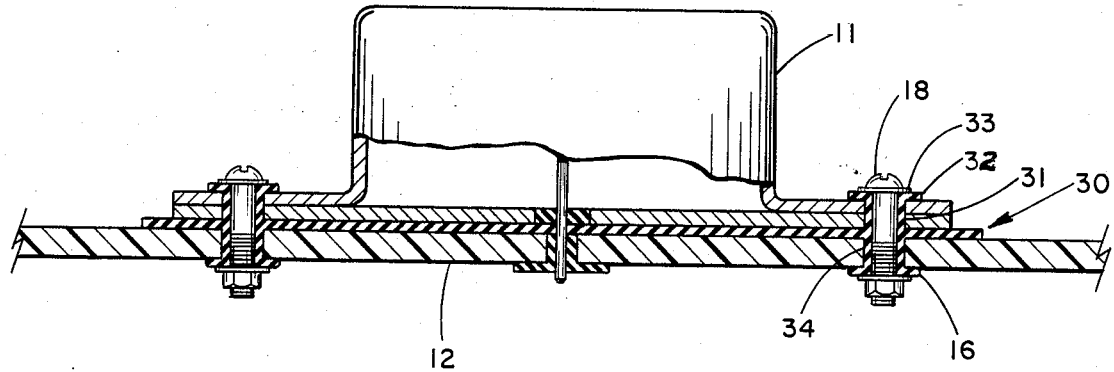
FIG. 5 is a view similar to FIG. 1, and illustrating a somewhat modified form of the thermally conductive electrically insulative mounting pad of the present invention.
Figure 6:
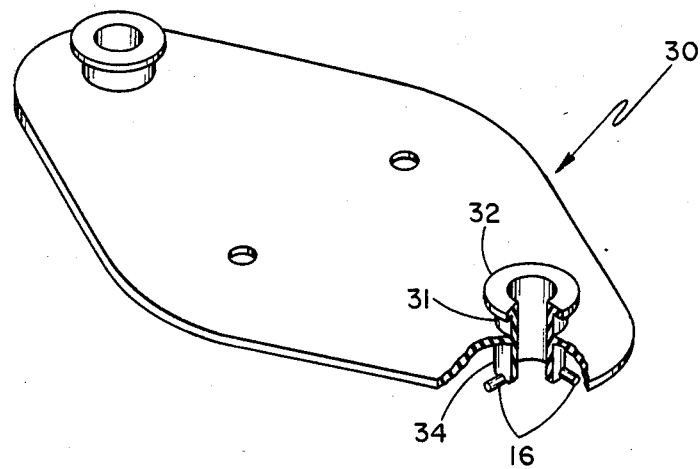
FIG. 6 is a partial perspective view of a thermally conductive electrically insulative member in accordance with the embodiment illustrated in FIG. 5.

Attention is directed to FIGS. 5 and 6 of the drawings wherein a modifed form of the invention is illustrated. In particular, and in FIG. 5, the semiconductor device 11 is mounted on substrate 12 upon the pad 30. Pad 30 is fabricated in substantilly the same fashion as pad member 10, with the exception being, however, that sleeve projection 34 extends in two directions from the planar portion of pad member 30. The lower end of tubular projection 34 is terminated in the same fashion as that in the modification shown in FIGS. 1–4 hereinabove; however, the upper portion of tubular projection 34 is provided with an upwardly extending segment 31 which terminates in an annular flange 32. Washer 33 is utilized to assist in assembly such as with bolt 18.

It will be appreciated that the various modifications may be employed in connection with the fabrication of thermally conductive electrically insulative members without departing from the scope of the present invention.

What is claimed is:
1. An electrically insulative member for use as a chassis mounting barrier in combination with a solid-state electronic device comprising:
   (a) a thin base pad member having an upper surface to receive a solid-state electronic device thereon and a lower surface and being disposed along a certain plane;
   (b) flexible tubular projections extending from the lower surface of said thin base pad member and defining bores extending from said base pad member to the ends of said tubular projections; and
   (c) a plurality of radially extending flexible and deformable retention burrs of cylindrical configuration integral with the distal ends of said tubular projections, the axes of said retention burrs being generally normal to the bore axis of each of said tubular projections.

2. The electrically insulative member as defined in claim 1 being particularly characterized in that said tubular projections and retention burrs consist of molded silicone rubber.

* * * * *